United States Patent [19]

Hoshino et al.

[11] Patent Number: 5,787,182
[45] Date of Patent: Jul. 28, 1998

[54] AUDIO SIGNAL AMPLIFIER CIRCUIT AND A PORTABLE AUDIO EQUIPMENT USING THE SAME

[75] Inventors: Taichi Hoshino; Isao Yamamoto; Masanori Fujisawa; Masato Kobayashi, all of Kyoto, Japan

[73] Assignee: Rohm Co., Ltd., Kyoto, Japan

[21] Appl. No.: 698,153

[22] Filed: Aug. 7, 1996

[30] Foreign Application Priority Data

Aug. 9, 1995 [JP] Japan ................................. 7-224815
May 21, 1996 [JP] Japan ................................. 8-148497

[51] Int. Cl.$^6$ ................................................ H04R 1/10
[52] U.S. Cl. ............................ 381/74; 381/121; 381/28
[58] Field of Search ............................. 381/74, 120, 121, 381/28, 98; 330/294, 107, 265, 271

[56] References Cited

U.S. PATENT DOCUMENTS 4,649,565  3/1987  Kaizer et al. ......................... 381/120
5,412,733  5/1995  Nagayoshi et al. ..................... 381/74

*Primary Examiner*—Curtis A. Kuntz
*Assistant Examiner*—Ping W. Lee
*Attorney, Agent, or Firm*—Fay, Sharpe, Beall, Fagan, Minnich & McKee

[57] ABSTRACT

The present invention resides in an audio amplifier circuit which includes an output terminal of an IC connected to a power amplifier circuit, a resistor having one end connected to a negative feedback input of the power amplifier circuit and the other end connected to a certain terminal other than the output terminal of the IC, a first capacitor connected between the output terminal and a loud speaker and a second capacitor connected between a wiring connecting the output terminal to the loud speaker and the certain terminal. A reduction of low frequency gain determined by a time constant of the first capacitor and an impedance of the loud speaker is corrected by an increase of of low frequency amplification gain determined by a time constant of the second capacitor and the resistor.

10 Claims, 4 Drawing Sheets

AUDIO SIGNAL AMPLIFIER CIRCUIT AND A PORTABLE AUDIO EQUIPMENT USING THE SAME

TECHNICAL FIELD

The present invention relates to an audio signal amplifier circuit and a portable audio equipment using the same circuit and, particularly, to an audio signal amplifier circuit in the form of an IC of portable audio equipment such as a portable magnetic tape player or a portable CD player which is to be thin and compact, whereby the size of an external capacitor to be added to the IC can be reduced.

BACKGROUND ART

A conventional headphone stereo, a conventional portable magnetic tape player such as DCC or DAT or a conventional portable disc player such as MD or CD is driven by one or two batteries. Therefore, a source voltage of an audio circuit is 1.2V or 2.4V at most. Furthermore, compactness and thinness of the audio equipment as well as high tone quality and high power in a low frequency band thereof have been requested.

In such portable audio equipment, it is requested that a single battery can be able to drive the equipment while realizing long playing time. Further, a recent circuit is provided with a low frequency band boost amplifier so that a low frequency band can be emphasized.

FIG. 6 shows an IC as an audio output circuit IC1 of such kind which houses a power amplifier circuit 4 having a single ended output stage to which an external output coupling capacitor (output capacitor) is connected. In a case of a stereo, a pair of such circuits for two channels are housed therein or the respective circuits are integrated. For simplicity of description, one of them, right channel or left channel, is shown in FIG. 6.

In FIG. 6, an output capacitor Co is externally connected to an output terminal 6 of the circuit IC1. In a circuit of this kind, when a lowest reproducible audio signal frequency fL is set to ten and several Hz, a capacitor of 3300 µF to 330 µF is necessary for an internal impedance RL of a loud speaker 2 which is in a range from 4Ω to 32Ω.

A feedback resistor Rf feeds an output of an operational amplifier (OP) 3 back to a negative input thereof to which a reference bias resistor Rs is connected. In FIG. 6, a reference numeral 5 denotes an input terminal, 7 an input signal source and 8 an external coupling capacitor.

Capacitance of the output capacitor Co is obtained by the following equation:

$$fL = 159 \times 10^3 / RL \times Co$$

Further, an output voltage Vo is determined by the following equation:

$$Vo = sCoRL \times Vp/(1+sCoRL)$$

where $s = j\omega$ and Vp is a voltage at the output terminal 6 of the IC1.

In a portable audio equipment, an arrangement of the output capacitor Co is a problem. Particularly, when the equipment is thin, this electrolytic capacitor has a breakdown voltage as well as capacitance proportional to its size (volume). Therefore, if the output capacitance exceeds 100 µF, it can not be incorporated in the IC1. On the other hand, if the capacitance of the output capacitor Co is made small enough to enable the capacitor to be incorporated in the IC1, a low frequency component of sound reproduced by a headphone, etc., may be not enough even if the low frequency range is boosted.

As compared with an audio equipment such as component stereo set which has enough margin or no limitation in a circuit size as well as power source voltage, the portable audio equipment is usually driven by a low voltage battery. Therefore, the portable equipment has been recognized as having lower tone quality. Recently, however, there is a tendency that, even for portable equipment, high tone quality is requested. Unfortunately, the high tone quality request for the low voltage driven portable equipment is hardly achieved practically.

SUMMARY OF THE INVENTION

An object of the present invention is to provide an audio signal amplifier circuit which can reproduce an audio signal without a sacrifice of low frequency tone quality even when a size of an output capacitor is reduced.

Another object of the present invention is to provide a compact and thin portable audio equipment having superior low frequency characteristics.

In order to achieve the above objects, an audio signal amplifier circuit and a portable audio equipment using the same, according to the present invention, which includes an IC containing a single-ended power amplifier circuit as an output stage, includes an output terminal of the IC, an output of the power amplifier circuit being connected to the output terminal, a resistor having one end connected to a negative feedback input of the power amplifier circuit and the other end connected to a certain terminal other than the output terminal of the IC, a first capacitor connected between the output terminal and a loud speaker and a second capacitor connected between a wiring connecting the output terminal to the loud speaker and the certain terminal, wherein a reduction of low frequency gain determined by a time constant of the first capacitor and an impedance of the loud speaker is corrected by an increase of low frequency amplification gain determined by a time constant of the second capacitor and the resistor.

According to the present invention, it is possible to expand a low frequency region of the audio amplifier circuit toward a lower frequency side by selecting values of the first and second external capacitors to change the time constants such that reduction of the low frequency amplification gain is substantially cancelled out by increase of the low frequency gain.

The output capacitor in such case may have a small value which has an attenuation gain characteristics before correction of the amplification gain characteristics in the low frequency range or before it is cancelled out. Thus, the low frequency cut-off frequency can be set to a value higher than that of the conventional circuit, so that it is possible to use a small capacitor as the external capacitor.

For example, it is possible to make the capacitance of the first output capacitor 100 µF or less which is a fraction of the conventional value of the first output capacitor by adding a small capacitor as small as 0.01 µF to 0.33 µF as the second capacitor, even if the reproducible lowest frequency fL is set to ten Hz or up to several Hz greater than 10 Hz as in the conventional manner.

As a result, it is possible to not use a large capacitor as the conventional output capacitor and to use a capacitor having a size capable of being incorporated in a compact and thin portable audio equipment.

BRIEF DESCRIPTION OF THE DRAWINGS

FIG. 2 is a graph showing a low frequency sound emphasizing characteristics of the circuit shown in FIG. 1, in which

DESCRIPTION OF THE PREFERRED EMBODIMENTS

Figure 1:
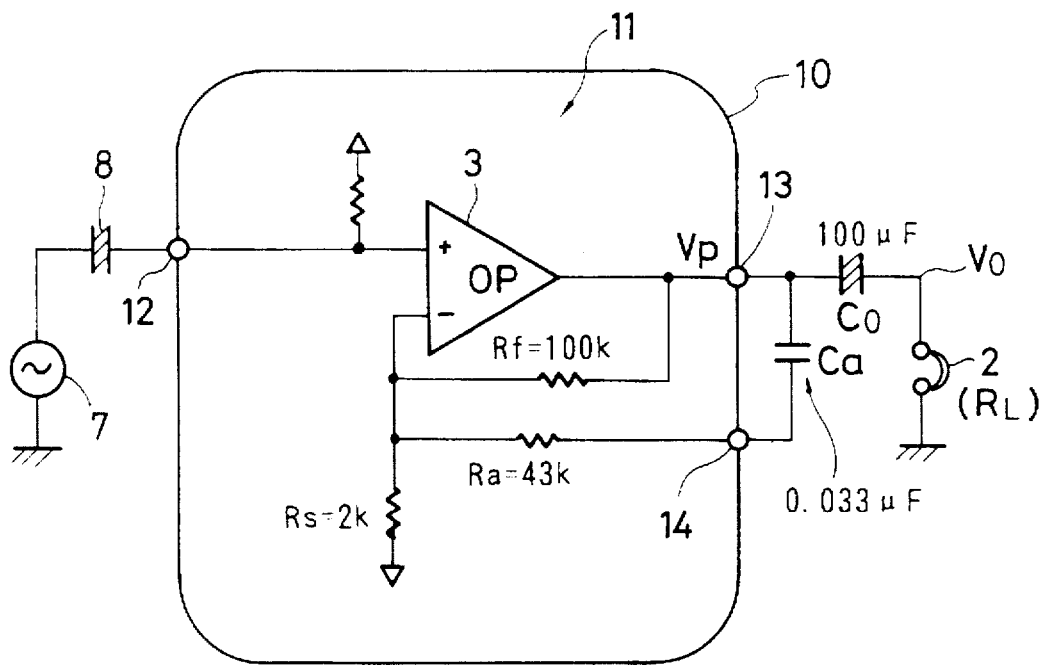
FIG. 1 is a block diagram showing an audio output circuit of a battery-driven portable audio equipment having an audio signal amplifier circuit according to the present invention.

In FIG. 1, a reference numeral 10 denotes an output circuit in the form of IC which contains, as an output stage, a power amplifier circuit 11 constructed with a single-ended operational amplifier 3, 12 an input terminal thereof and 13 an output terminal thereof. The operational amplifier 3 includes a first feedback resistor Rf having a value of 100 kΩ and a reference side bias resistor Rs having a value of 2 kΩ. In FIG. 1, same components as those in FIG. 6 are denoted by same reference numerals, respectively.

The power amplifier circuit 11 includes a second feedback resistor Ra having a value of 43 kΩ and connected between a terminal 14 of the IC circuit and a negative (−) input (negative feedback side input) of the operational amplifier 3. A film or tantalum capacitor Ca of 0.033 μF is connected between the output terminal 13 and the terminal 14 of the IC as an external capacitor and an electrolytic capacitor Co of 100 μF is connected between the output terminal 13 and a loud speaker 3 (for example, a head-phone speaker) as an output capacitor.

Figure 6:
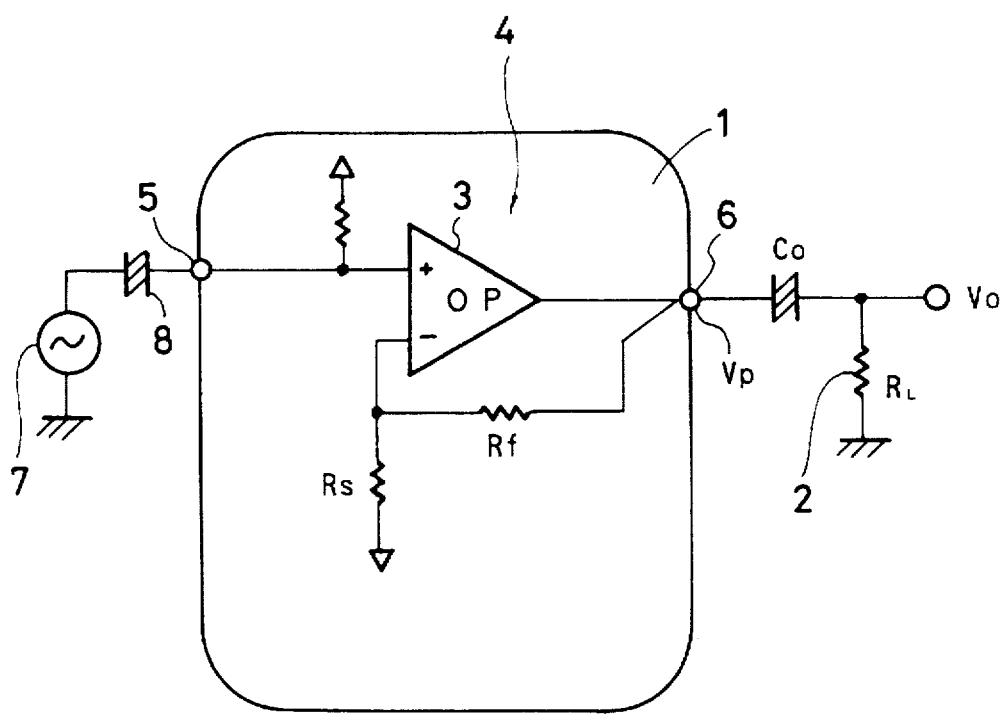
FIG. 6 is a block diagram of an audio output circuit of a conventional battery-driven audio equipment.

The value of the first feedback resistor Rf in FIG. 1 is larger than that of the feedback resistor Rf in FIG. 6 so that a total amount of feedback obtainable by the first feedback resistor Rf and the second feedback resistor Ra in FIG. 1 corresponds substantially to a feedback amount obtainable by the feedback resistor Rf of the conventional circuit shown in FIG. 6. An amplification of the power amplifier circuit 11 in FIG. 1 corresponds substantially to that of the power amplifier circuit 4 shown in FIG. 6.

Figure 2A:
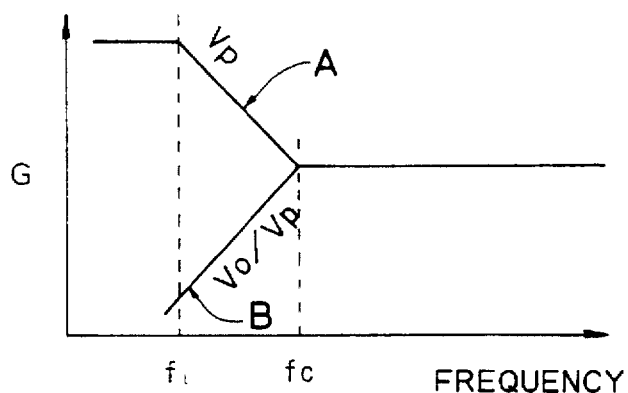
FIG. 2(a) is an output voltage characteristics of the circuit and a loud speaker as a load of the circuit and FIG. 2(b) is a total gain characteristics of the audio equipment.
Figure 2B:
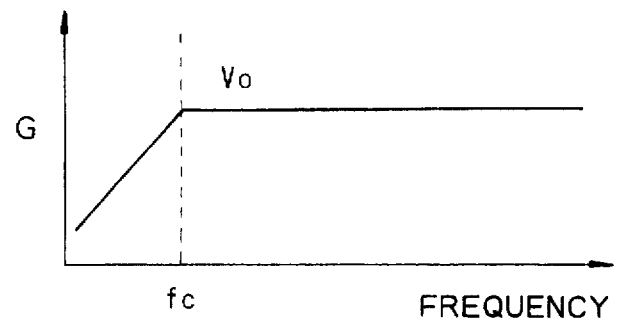

Therefore, the amplification of the power amplifier circuit 11 is increased with respect to that of the conventional circuit correspondingly to an increase of an impedance thereof in a low frequency band by the use of the output capacitor Ca. FIGS. 2a and 2b show the low frequency characteristics of the power amplifier circuit 11 with respect to the output of the amplifier and the output of the loud speaker 2.

An output voltage Vp at the output terminal 13 is given by the following equation:

$$Vp = \{1 + Rf\|(Ra + 1/sCa)/Rs\} \times Vin$$

where Vin is an input signal voltage and Rf∥* is a total resistance value of a parallel circuit of the resistor Rf and a resistor *.

The output voltage Vo to be supplied to the loud speaker 2 is sCoRL×Vp/(1+sCoRL), as mentioned previously.

FIG. 2(a) is a graph showing the frequency vs. gain characteristics of the output voltage Vp and FIG. 2(b) is a graph showing an output total gain characteristics (gain characteristics of the output voltage Vo) of the loud speaker 2 in the low frequency region. In FIG. 2(a), an inclined characteristics A is the frequency vs. gain characteristics of the output voltage Vp at the output terminal 13 and an inclined characteristics B is the gain vs. the output voltage Vo of the loud speaker 2 with respect to the output voltage Vp, that is, Vo/Vp in the low frequency range.

In FIGS. 2(a) and 2(b), the lower reproducible limit frequency fL and a cut-off frequency fc are:

$$fL = 1/2\pi Ca(Rf + Ra)$$

$$fc = 1/2\pi CaRa$$

In FIG. 2(a), the characteristics A in which the gain, that is, amplification, increases with decrease of frequency at a rate determined by the time constant of the R-C circuit composed of the capacitor Ca and the resistor Ra and the characteristics B in which the gain decreases with decrease of frequency at a rate determined by the time constant of the R-C circuit composed of the capacitor Co and the impedance of the loud speaker 2 are in a mutually cancelling relation.

This can be understood from the fact that the product of the capacitor Ca and the resistor Ra is, in this case, 100[μF] ×16 [Ω]=1600[μF·Ω] is substantially equal in frequency characteristics to the product of the capacitor Co and the impedance of the loud speaker which is 0.03[μF]×43000[Ω] =1419[μF·Ω].

In the embodiment shown in FIG. 1, the capacitance of the capacitor Co may be about 30% of that of the conventional output capacitor Co. That is, when the impedance of the loud speaker 2 is 16Ω, the output capacitor Co according to the present invention is about 15 μF while, in the conventional circuit, it must be 47 μF.

Similarly, according to the present invention, Co can be 33 μas opposed to 100 μF, 75 μF as opposed to 220 μF, or 100 μF as opposed to 330 μF.

Further, since the capacitance of the second feedback capacitor Ca can be small and can be selected relatively freely, it can be easily arranged in the audio equipment. Further, it is possible to use the output capacitor having smaller capacitance by employing the loud speaker 2 having larger impedance. Since there are headphone speakers having impedance of 32Ω or larger, an audio equipment using such headphone speaker can be made thinner.

In the description of the embodiment shown in FIG. 1, a D.C. resistance of the output capacitor Co and a D.C. resistance of the loud speaker 2 are not considered. Due to the existence of such D.C. resistances, the gain in the low frequency range is reduced more or less.

Figure 3:
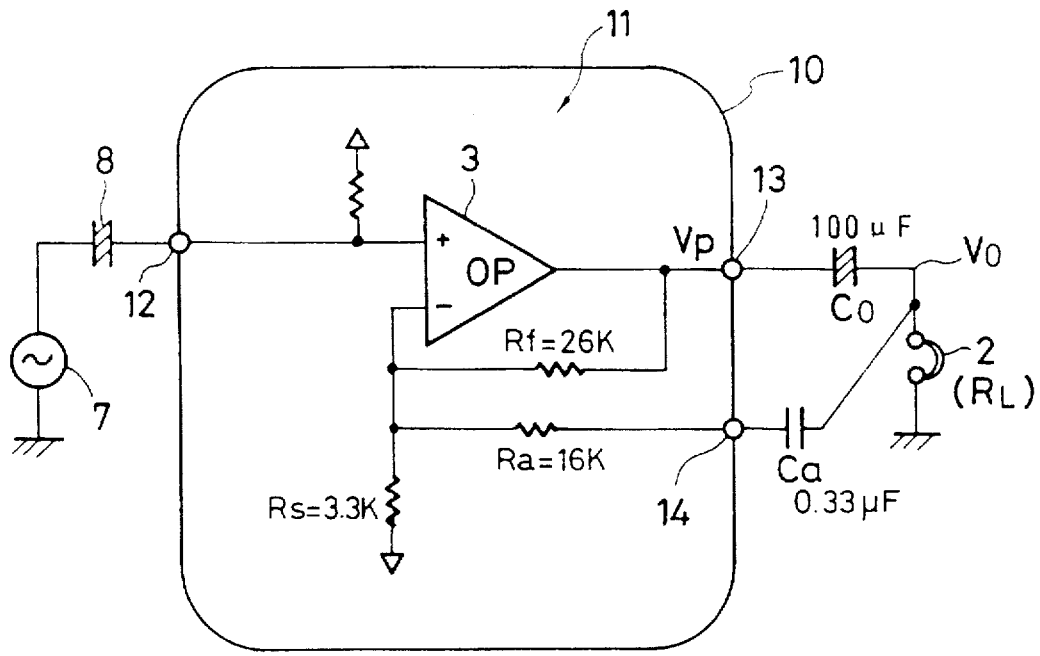
FIG. 3 is a block circuit diagram of an audio output circuit of another example of an audio equipment having the audio signal amplifier circuit according to the present invention.

FIG. 3 shows an embodiment which can avoid the reduction of gain in the low frequency range due to such D.C. resistance. The embodiment shown in FIG. 3 differs from the embodiment shown in FIG. 1 in that the capacitor Ca is connected between the terminal 14 and a junction between the output capacitor Co and the headphone speaker 2. In the embodiment in FIG. 3, the feedback voltage is a voltage at the terminal of the headphone speaker 2. Since the amount of feedback in the low frequency range is reduced correspondingly thereto, it is possible to increase the amplification in the low frequency range.

A gain error $E_G$ in the low frequency range due to the D.C. resistance is calculated by representing the D.C. resistance value of the output capacitor and that of the load, that is, the loud speaker 2 by r and PL, respectively, and neglecting the impedances of the capacitors Ca and Co in the low frequency range.

Gain Ga when there is no internal resistance r becomes as follow:

$$Ga=(Rs+RL\|Ra)/Rs$$

Gain Gr when there is the internal resistance r becomes as follow:

$$Gr=Ga\times\{RL/(RL+R)\}$$

Therefore, the gain error EG is represented by the following equation:

$$EG=20 \log (Gr/Ga)=20 \log \{RL/(RL+r)\}$$

By putting RL and r in the example shown in FIG. 3 as 16Ω and 2Ω, respectively, $$E_G=16/(16+2)=-1.02 \text{ dB}$$

Figure 4:
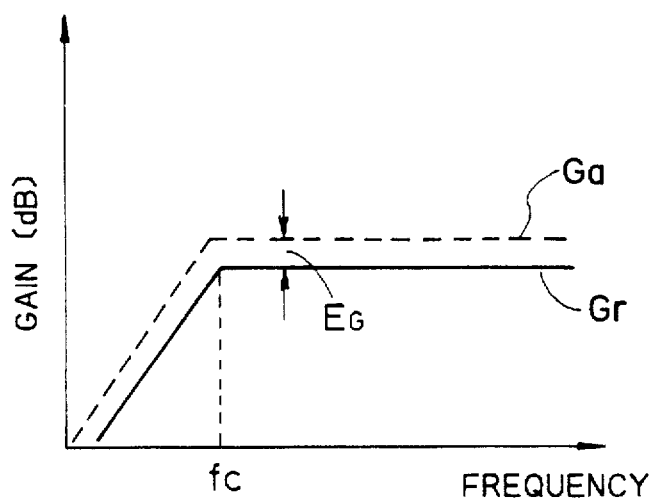
FIG. 4 illustrates an error of low frequency gain due to an internal resistance of an output capacitor.

FIG. 4 shows gain Ga shown by a dotted line is reduced to gain Gr shown by a solid line by $E_G$.

In order to correct the gain error $E_G$, the cutoff frequency fc of a correction circuit of Ca and Ra is made about three times, in this case, fc is set to $3/2\pi CaRa$.

Assuming the value of the resistor Ra before correction as, for example, 16 kΩ and the value of the capacitor Ca in FIG. 1 as in the order of 0.1 μF so that the time constant CaRa becomes 1600 [μF·QΩ] as in the described case, the value of the capacitor Ca after correction becomes 0.33 μF as shown in FIG. 3 which is substantially three times the value of the capacitor Ca before correction. Incidentally, the respective circuit elements have values predetermined statistically. For example, when a calculated value of a capacitor is 0.3 μF, a capacitor having capacitance of 0.33 μF is selected as the value near the calculated value.

Figure 5:
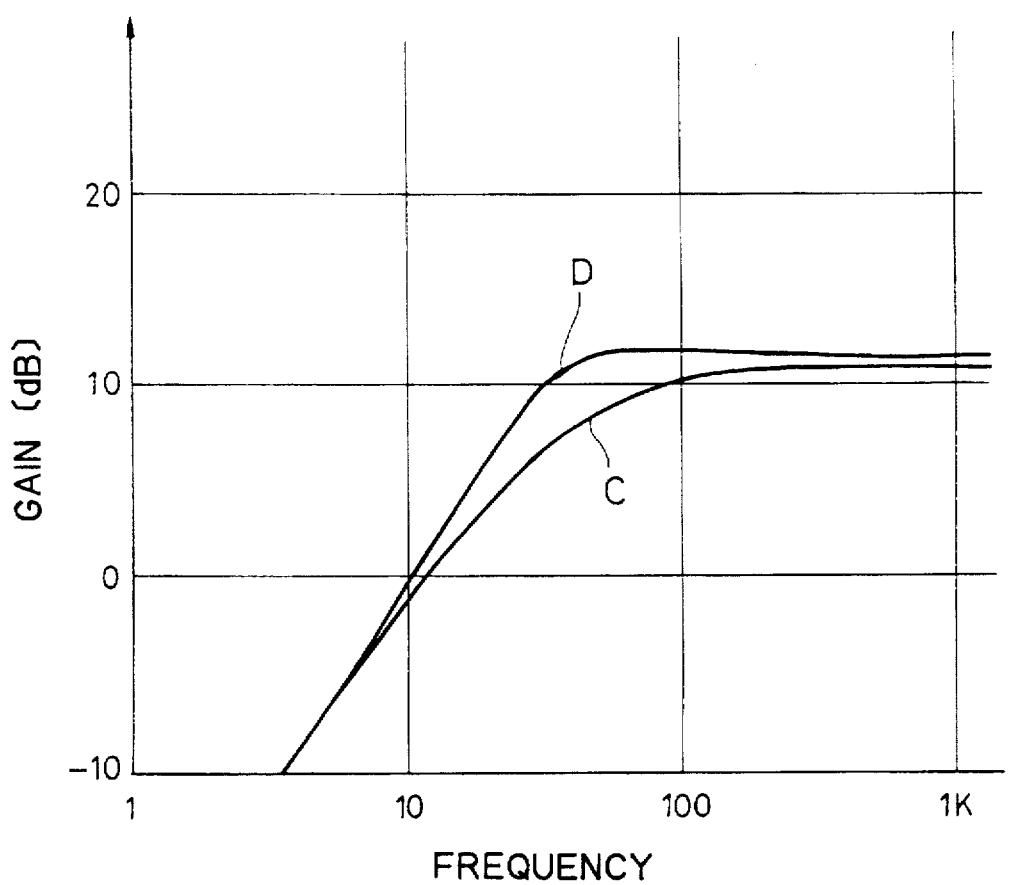
FIG. 5 is a graph showing a difference in gain characteristics between the audio equipments shown in FIGS. 3 and 1.

FIG. 5 is a graph showing the difference in the gain in the low frequency range between the circuit shown in FIG. 1 in which Ra=16 kΩ and Ca=0.1 μF and the circuit shown in FIG. 3 in which Ra=16 kΩ and Ca=0.33 μF.

The gain vs. frequency characteristics C is that of the circuit before correction which is shown in FIG. 1 and the gain vs. frequency characteristics D is that of the circuit after correction which is shown in FIG. 3. As shown in FIG. 5, the gain in the low frequency range from 40 Hz to 200 Hz, particularly, from 40 Hz to 60 Hz, is improved.

What is claimed is:

1. An audio signal amplifier circuit including an integrated circuit containing a single-ended power amplifier circuit as an output stage, said audio signal amplifier circuit comprising an output terminal of said integrated circuit, an output of said power amplifier circuit being connected to said output terminal, a resistor having one end connected to a negative feedback input of said power amplifier circuit and the other end connected to a certain terminal other than said output terminal of said integrated circuit, a first capacitor connected between said output terminal and a loud speaker and a second capacitor connected between a wire connecting said output terminal to said loud speaker and said certain terminal, an internal impedance of said loud speaker is in a range from 4Ω to 32Ω and said first capacitor has a capacitance of less than 330 μF, wherein a reduction of low frequency gain determined by a time constant of said first capacitor and an impendance of said loud speaker is corrected by an increase of low frequency amplification gain determined by a time constant of said second capacitor and said resistor.

2. An audio signal amplifier circuit as claimed in claim 1, wherein capacitances of said first capacitor and said second capacitor are selected such that the reduction of low frequency gain determined by the time constant of said first capacitor and the impedance of said loud speaker is substantially cancelled out by the increase of low frequency amplification gain determined by the time constant of said second capacitor and said resistor.

3. An audio signal amplifier circuit as claimed in claim 2, wherein said loud speaker is a headphone speaker, said power amplifier circuit is an operational amplifier including a feedback resistor connected to said negative feedback input side, said first capacitor has a capacitance of 100 μF or less and the low frequency determined by the time constant of said second capacitor and said resistor is in a range from 40 Hz to 200 Hz.

4. An audio signal amplifier circuit as claimed in claim 1, wherein said second capacitor is connected between said certain terminal and said output terminal.

5. An audio signal amplifier circuit as claimed in claim 1, wherein said second capacitor is connected between said certain terminal and a junction between said first capacitor and said loud speaker.

6. An audio signal amplifier circuit as claimed in claim 5, wherein said loud speaker is a headphone speaker, said power amplifier circuit is an operational amplifier including a feedback resistor connected to said negative feedback input side, said first capacitor has a capacitance of 100 μF or less and the low frequency determined by the time constant of said second capacitor and said resistor is in a range from 40 Hz to 200 Hz.

7. A portable audio equipment including an integrated circuit containing a single-ended power amplifier circuit as an output stage, said portable audio equipment comprising an output terminal of said integrated circuit, an output of said power amplifier circuit being connected to said output terminal, a resistor having one end connected to a negative feedback input of said power amplifier circuit and the other end connected to a certain terminal other than said output terminal of said integrated circuit, a first capacitor connected between said output terminal and a loud speaker and a second capacitor connected between a wire connecting said output terminal to said loud speaker and said certain terminal, an internal impedance of said loud speaker is in a range from 4Ω to 32Ω and said first capacitor has a capacitance of less than 330 μF, wherein a reduction of low frequency gain determined by a time constant of said first capacitor and an impedance of said loud speaker is corrected by an increase of low frequency amplification gain determined by a time constant of said second capacitor and said resistor.

8. A portable audio equipment as claimed in claim 7, wherein capacitances of said first capacitor and said second capacitor are selected such that the reduction of low frequency gain determined by the time constant of said first capacitor and the impedance of said loud speaker is substantially cancelled out by the increase of low frequency amplification gain determined by the time constant of said second capacitor and said resistor.

9. A portable audio equipment as claimed in claim 8, wherein said second capacitor is connected between said certain terminal and said output terminal, said loud speaker is a headphone speaker, said power amplifier circuit is an operational amplifier including a feedback resistor connected to said negative feedback input side, said first capacitor has a capacitance of 100 μF or less and the low frequency determined by the time constant of said second capacitor and said resistor is in a range from 40 Hz to 200 Hz.

10. A portable audio equipment as claimed in claim 8, wherein said second capacitor is connected between said certain terminal and a junction between said second capacitor and said loud speaker, said loud speaker is a headphone speaker, said power amplifier circuit is an operational amplifier including a feedback resistor connected to said negative feedback input side, said first capacitor has a capacitance of 100 μμF or less and the low frequency determined by the time constant of said second capacitor and said resistor is in a range from 40 Hz to 200 Hz.

* * * * *